United States Patent
Chen et al.

(10) Patent No.: US 12,274,058 B2
(45) Date of Patent: Apr. 8, 2025

(54) MEMORY DEVICE

(71) Applicant: MACRONIX INTERNATIONAL CO., LTD., Hsinchu (TW)

(72) Inventors: Shih-Hung Chen, Hsinchu County (TW); Chun-Hsiung Hung, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 504 days.

(21) Appl. No.: 17/699,212

(22) Filed: Mar. 21, 2022

(65) Prior Publication Data
US 2023/0301084 A1 Sep. 21, 2023

(51) Int. Cl.
| | |
|---|---|
| H10B 41/35 | (2023.01) |
| G11C 16/04 | (2006.01) |
| H01L 23/522 | (2006.01) |
| H01L 23/528 | (2006.01) |
| H10B 12/00 | (2023.01) |
| H10B 41/20 | (2023.01) |
| H10B 43/20 | (2023.01) |
| H10B 43/35 | (2023.01) |

(52) U.S. Cl.
CPC ......... *H10B 41/35* (2023.02); *G11C 16/0483* (2013.01); *H01L 23/5226* (2013.01); *H01L 23/5283* (2013.01); *H10B 12/30* (2023.02); *H10B 41/20* (2023.02); *H10B 43/20* (2023.02); *H10B 43/35* (2023.02)

(58) Field of Classification Search
None
See application file for complete search history.

(56) References Cited

U.S. PATENT DOCUMENTS

| | | | |
|---|---|---|---|
| 8,399,973 B2 | 3/2013 | Oh et al. | |
| 9,251,863 B2 | 2/2016 | Kim et al. | |
| 2011/0024816 A1* | 2/2011 | Moon | H01L 29/7926 257/329 |
| 2013/0277831 A1* | 10/2013 | Yoon | H01L 24/13 257/737 |
| 2015/0199126 A1* | 7/2015 | Jayasena | G06F 12/0292 711/170 |
| 2018/0046908 A1* | 2/2018 | Cox | G06N 3/065 |
| 2018/0210830 A1* | 7/2018 | Malladi | H01L 25/0652 |
| 2019/0050325 A1* | 2/2019 | Malladi | G06F 12/0862 |
| 2020/0328180 A1* | 10/2020 | Cheng | H01L 25/18 |

FOREIGN PATENT DOCUMENTS

TW 201448071 A 12/2014

OTHER PUBLICATIONS

Shine Kim et al., "Behemoth: A Flash-centric Training Accelerator for Extreme-scale DNNs", 19th USENIX Conference on File and Storage Technologies, pp. 371-385, Feb. 23-25, 2021.

\* cited by examiner

*Primary Examiner* — Erik Kielin
(74) *Attorney, Agent, or Firm* — McClure, Qualey & Rodack, LLP

(57) ABSTRACT

A memory device for artificial intelligence calculation includes a memory structure, a controller chip, and a processer chip. The memory structure includes a first memory chip, and a stack of second memory chips, in which a memory density of each of the second memory chips is greater than a memory density of the first memory chip. The controller chip is electrically connected to the first memory chip and the second memory chips. The processer chip is electrically connected to the controller chip.

16 Claims, 6 Drawing Sheets

MEMORY DEVICE

BACKGROUND

Field of Invention

The present invention relates to a memory device.

Description of Related Art

In recent years, the structure of semiconductor device has changed rapidly, and the storage capacity of semiconductor device increases continuously. Memory device has been widely used in storage device of several products. With the increasing applications, it is desired that memory device has small dimension and large memory capacity. To fulfill the requirement, a memory device having high density and small dimension is needed.

SUMMARY

According to some embodiments of the present disclosure, a memory device includes a memory structure, a controller chip, and a processer chip. The memory structure includes a first memory chip, and a stack of second memory chips, in which a memory density of each of the second memory chips is greater than a memory density of the first memory chip. The controller chip is electrically connected to the first memory chip and the second memory chips. The processer chip is electrically connected to the controller chip.

In some embodiments, the second memory chips are stacked in a staircase manner.

In some embodiments, a number of the second memory chips is equal to or greater than 4.

In some embodiments, the memory density of the second memory chips is equal to or greater than 8 times the memory density of the first memory chip.

In some embodiments, the first memory chip includes a number of inputs/outputs $IO_D$ and a data rate $f_D$, each of the second memory chips includes a number of inputs/outputs $IO_N$, a data rate $f_D$, and a number of the second memory chips is $N_s$, the first memory chip and the second memory chips satisfy $IO_D*f_D>=IO_N*f_N N_s$.

In some embodiments, a number of inputs/outputs of the first memory chip is greater than a number of inputs/outputs of each of the second memory chips.

In some embodiments, the first memory chip is between the stack of the second memory chips and the controller chip.

In some embodiments, the memory device further includes a plurality of first bumps in contact with a bottom surface of the first memory device and a top surface of the controller chip; a plurality of conductive vias in contact with bottom surfaces of the second memory chips, respectively; and a plurality of second bumps connecting the conductive vias respectively to the top surface of the controller chip.

In some embodiments, the memory device further includes a plurality of bumps in contact with a bottom surface of the first memory chip and a top surface of the controller chip; and a plurality of conductive wire connecting top surfaces of the second memory devices respectively to the top surface of the controller chip.

In some embodiments, each of the second memory chips has a NAND architecture.

In some embodiments, the NAND architecture includes a bit line, word lines, memory units, and a transistor. The memory units are connected in series, in which the word lines are electrically connected to the memory units, respectively. The transistor connects one of the memory units to the bit line.

In some embodiments, the first memory chip includes a DRAM.

In some embodiments, the memory device further includes a dielectric material surrounding the stack of the second memory chips.

In some embodiments, the first memory chip is separated from a bottommost one of the second memory chips by the dielectric material.

In some embodiments, the first memory chip is in contact with a bottommost one of the second memory chips.

In some embodiments, the first memory chip is electrically connected to the controller chip through a bottom side of the first memory chip, and each of the second memory chips is electrically connected to the controller chip through a bottom side of each of the second memory chips.

In some embodiments, the first memory chip is electrically connected to the controller chip through a bottom side of the first memory chip, and each of the second memory chips is electrically connected to the controller chip through a top side of each of the second memory chips.

In some embodiments, the memory device further includes an interposer electrically connecting the controller chip to the processor chip, in which the controller chip and the processor chip are disposed on a same side of the interposer.

In some embodiments, the memory device further includes an interposer electrically connecting the controller chip to the processor chip, in which the controller chip and the processor chip are disposed on opposite sides of the interposer.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
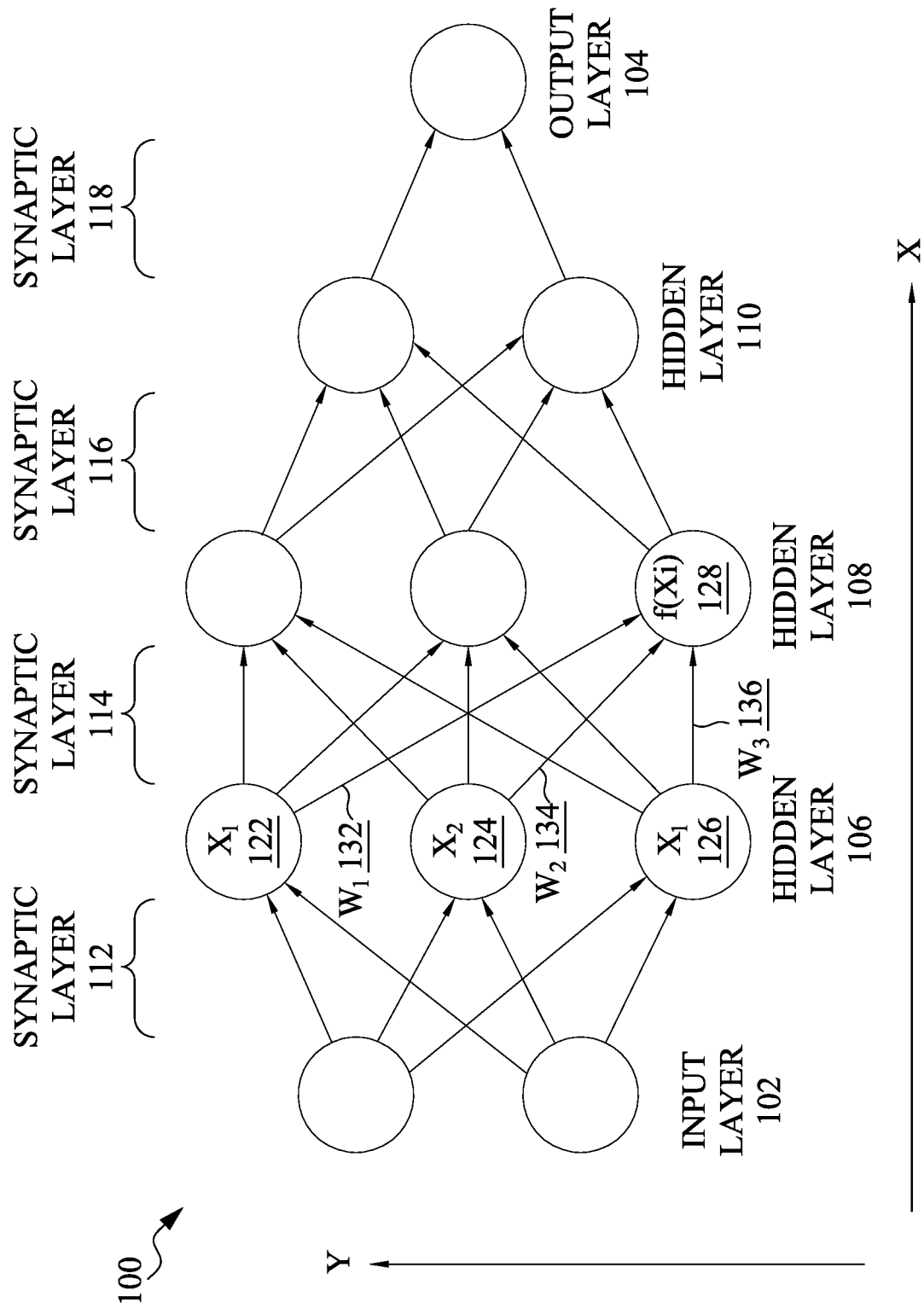
FIG. 1 is a schematic view of Deep Leaning Neural Network in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a schematic view of Deep Leaning Neural Network in accordance with some embodiments of the present disclosure. A neural network is an information processing paradigm that is inspired by the way biological nervous systems process information. With the availability of large training datasets and sophisticated learning algorithms, neural networks have facilitated major advances in numerous domains such as computer vision, speech recognition, and natural language processing.

The basic unit of computation in a neural network is a neuron. A neuron receives inputs from other neurons, or from an external source and computes an output. FIG. 1 illustrates an example neural network 100. The neural network 100 contains multiple neurons arranged in layers. The neural network 100 includes an input layer 102 of input neurons (i.e., neurons that provide the input data), three hidden layers 106, 108 and 110 of hidden neurons (i.e., neurons that perform computations and transfer information from the input neurons to the output neurons), and an output layer 104 of output neurons (i.e., neurons that provide the output data). Neurons in adjacent layers have synaptic layers of connections between them. For example, the synaptic layer 112 connects neurons in the input layer 102 and the hidden layer 106, the synaptic layer 114 connects neurons in the hidden layers 106 and 108, the synaptic layer 116 connects neurons in the hidden layers 108 and 110, and the synaptic layer 118 connects the neurons in the hidden layer 110 and the output layer 104. All these connections have weights associated with them. For example, the neurons 122, 124 and 126 in the hidden layer 106 are connected to a neuron 128 in the hidden layer 108 by connections with weights $w_1$ 132, $w_2$ 134 and $w_3$ 136, respectively. The output for the neuron 128 in the hidden layer 108 can be calculated as a function of the inputs ($x_1$, $x_2$, and $x_3$) from the neurons 122, 124 and 126 in the hidden layer 106 and the weights $w_1$ 132, $w_2$ 134 and $w_3$ 136 in the connections. The function can be expressed as follows:

$$f(x_i) = \sum_{i=1}^{M} w_i x_i$$

In the sum-of-products expression above, each product term is a product of a variable input xi and a weight $w_i$. The weight $w_i$ can vary among the terms, corresponding, for example, to coefficients of the variable inputs $x_i$. Similarly, outputs from the other neurons in the hidden layer can also be calculated. The outputs of the two neurons in the hidden layer 110 act as inputs to the output neuron in the output layer 104.

Neural networks can be used to learn patterns that best represent a large set of data. The hidden layers closer to the input layer learn high level generic patterns, and the hidden layers closer to the output layer learn more data-specific patterns. Training is a phase in which a neural network learns from training data. During training, the connections in the synaptic layers are assigned weights based on the results of the training session. Inference is a stage in which a trained neural network is used to infer/predict input data and produce output data based on the prediction.

In the neural network 100 of FIG. 1, each point and line is a data, and will be stored in a memory. In FIG. 1, the X direction can be regarded as model depth, the Y direction can be regarded as model width, Z direction (not shown) can be regarded as batch size for parallel processing, and thus XYZ can be regarded as requirement of memory.

The purpose of training the neural network is to improve the learning ability of the network. In greater details, neural network calculates a predicted result of an input via forward calculation, and the predicted result is compared with a standard answer. The difference between the predicted result and the standard answer will be sent back to the neural network via backward propagation. The weights of the neural network will be updated according to the difference. Generally, the forward calculation can be regarded as proceeding sum-of-products, layer by layer, along the +X direction of FIG. 1. On the other hand, the backward propagation can be regarded as proceeding complex differential calculation, layer by layer, along the −X direction of FIG. 1.

After the above operations are completed, the memory data will be changed once or twice. For example, in forward calculation, few memory data will be changed. While in backward propagation, many memory data will be changed.

As an example of forward calculation, data of neurons of each layer are calculated in three stages, in which the first stage a is read/write data of neurons, the second stage b is read/write data of weights, and the third stage c is calculation. Take the neuron 128 as an example, in the first stage a, memory reads the data of neurons 122, 124, and 126 of the hidden layer 106. In the second stage b, the memory reads the data of weights $w_1$ 132, $w_2$ 134, and $w_3$ 136 of the synaptic layer 114. In the third stage c, the above sum-of-products expression is calculated by a processor.

The above three stages can be referred to as a calculation cycle. In some embodiments, the number of layers of the neural network 100 is equal to the number of the calculation cycles. For example, if the neural network 100 has 100 layers, 100 calculation cycles is performed during the forward calculation.

In the backward propagation, similar operations are performed. For example, in the backward propagation, read/write data of neurons (first stage a), read/write data of weights (second stage b), and calculation (third stage c) are conducted. As mentioned above, the backward propagation includes complex differential calculation, and the backward propagation needs to read/write large amount of data of weights. Accordingly, the time duration of a backward propagation is longer than the time duration of a forward calculation. In some embodiments, an inference operation only includes a forward calculation, and thus the operation time is short. However, a training operation includes a forward calculation and a backward propagation, so the operation time is longer and is mainly due to the calculation of backward propagation.

In a calculation cycle, the first stage a and the second stage b is related to read/write of memory, the memory is operated in high speed during these stages. However, in the third stage c, the read data are calculated are by a processor, while the memory is not operated. In some embodiments, the processor includes GPU, TPU, extremely small CPU, DPU, APU, or the like.

Conventional high bandwidth memory (HBM) is widely used in artificial intelligence calculation. HBM includes a plurality of stacked DRAM chips. As mentioned above, during the first stage a and the second stage b, memory is operated in high speed, while the memory is not operated during the third stage c. Experiment result shows that the operation time that the DRAM is operated in full speed only occupies 3.2% of the total operation time of a calculation cycle.

To solve the above issue, the present disclosure provides a memory device that includes several stacked memory chips, in which only a small part of the memory chips requires high speed operation, and another part of the memory chips can include several high density memory having NAND architecture. During the third stage c mentioned above, data are transferred from the high speed memory to the memory having NAND architecture, which will reduce requirement of memory speed, and will be beneficial for increasing memory density.

Figure 2:
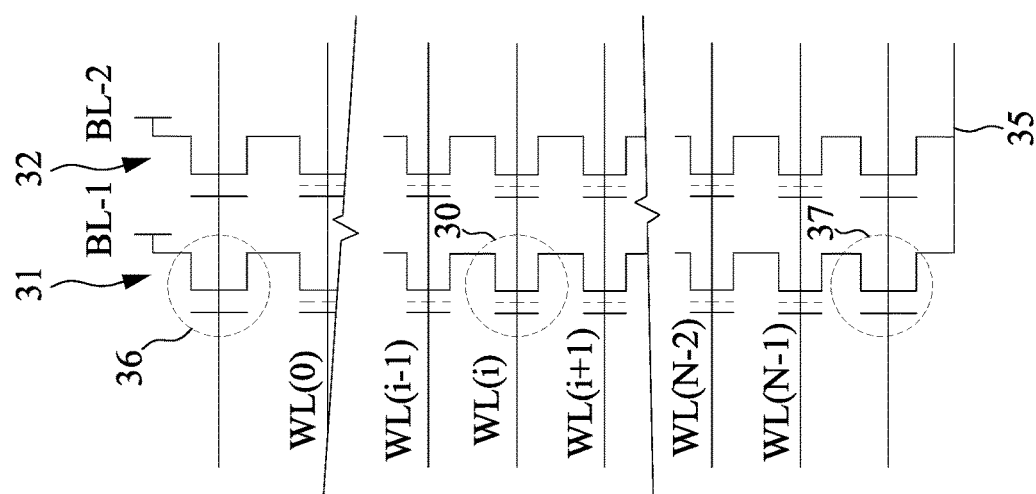
FIG. 2 is a circuit diagram of a memory having NAND architecture in accordance with some embodiments of the present disclosure.

FIG. 2 is a circuit diagram of a memory having NAND architecture in accordance with some embodiments of the present disclosure. In some embodiments, the memory having NAND architecture includes NAND strings 31, 32, in which each of the NAND strings 31, 32 includes several memory units (or memory cells) 30 connected in series. In some embodiments, each memory unit 30 has a structure similar to transistor. Each memory unit may include core memory material. In some embodiments, the core memory material may be charge trapping material, such as SiN, or other suitable materials. In other embodiments, the core memory material can be conductor or doped semiconductor, such as floating gate device.

The memory having NAND architecture also includes word lines WL, which are electrically connected to the memory units 30, respectively. In some embodiments, each word line WL is electrically connected to a gate of a corresponding memory unit 30.

The NAND strings 31, 32 are connected to corresponding bit lines BL-1, BL-2 through respective string select transistors 36, and are connected to common source line 35 through respective ground select transistor.

In a conventional non-volatile NAND memory, the memory unit is small and thus the memory capacity is large. Furthermore, non-volatile NAND memory generally includes high retention, low latency, and poor endurance. Thus, non-volatile NAND memory is commonly used in storage device, such as hard disk (HD).

In the present disclosure, the disclosed memory having NAND architecture has greater endurance by tuning thickness or material of the charge trapping material, or by changing program/erase method. In some embodiments, the endurance of the memory having NAND architecture is in a range from about $10^6$ times to about $10^{10}$ times. In some embodiments, the retention of the memory having NAND architecture is less than the retention of conventional non-volatile NAND memory. For example, the retention of conventional non-volatile NAND memory can be about 10 years, while the retention of the memory having NAND architecture can be about 1 second to about 1 year. In some embodiments, the disclosed memory having NAND architecture may include "volatile" property, and thus a refresh mechanism is needed to maintain the data. Thus, the disclosed memory having NAND architecture may also be referred to as volatile NAND memory. Here, the term "endurance" may indicate the number of times that a memory device can perform the program/erase cycle before it fails to read back the proper data. The term "retention" can be referred to the longest time that a stored data can be maintained in a memory cell.

Based on the above discussion, the disclosed memory having NAND architecture only preserves the advantage of high density as conventional non-volatile NAND memory, but also has greater endurance. Although the disclosed memory having NAND architecture may include poor latency, the calculation of big data and artificial intelligence has less requirement of latency as discussed above. Accordingly, the "volatile" memory having NAND architecture is beneficial for the calculation of big data and artificial intelligence.

Figure 3:
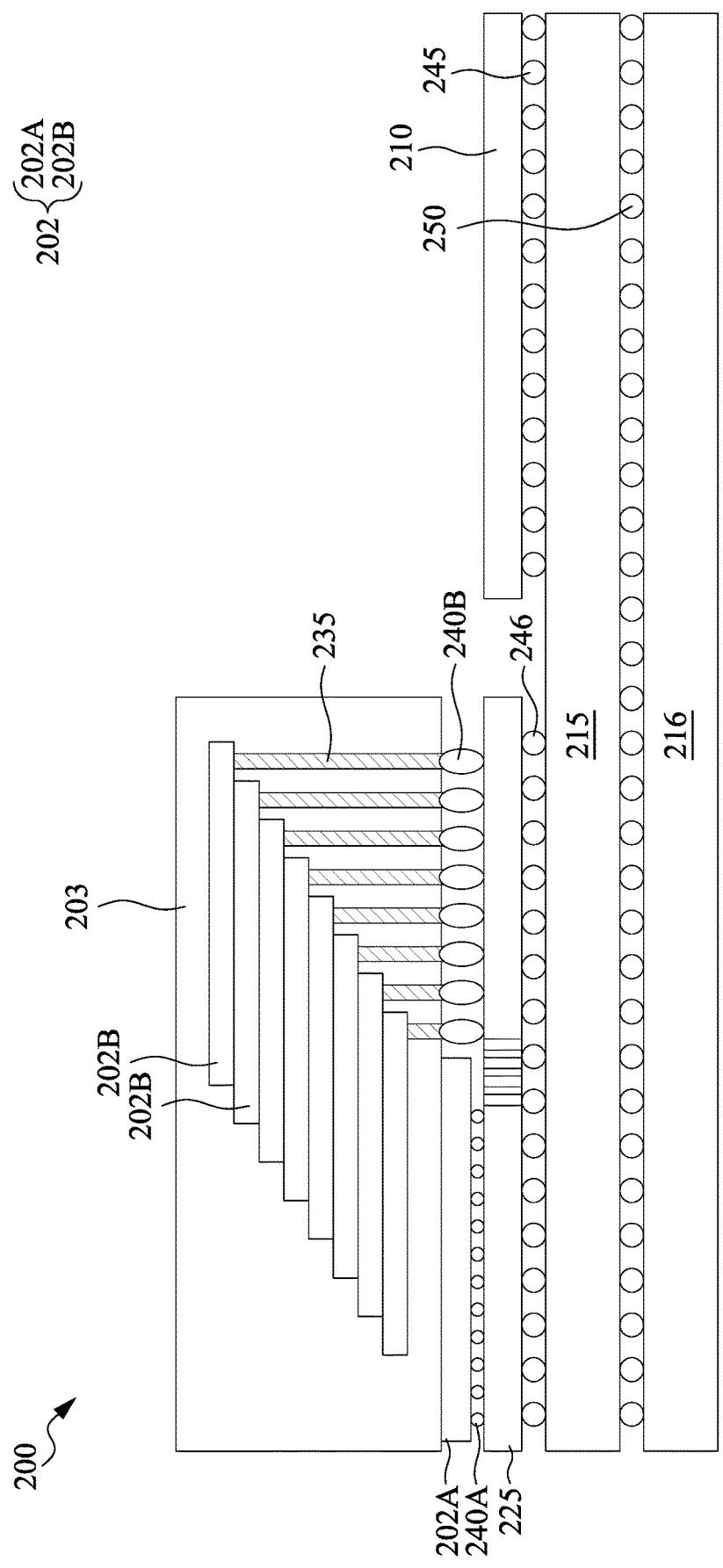
FIG. 3 is a schematic view of a memory device in accordance with some embodiments of the present disclosure.

FIG. 3 is a schematic view of a memory device in accordance with some embodiments of the present disclosure. Shown there is a memory device 200 for artificial intelligence, in which the memory device 200 can be sued to conduct the training of a neural network as discussed in FIG. 1. The memory device 200 includes a memory structure 202, a controller chip 225, a processor chip 210, an interposer 215, and a package substrate 216.

The memory structure 202 can be referred to as an aspect of 3D memory array. For example, the memory structure 202 includes a memory chip 202A, and a plurality of memory chips 202B stacked in a staircase manner. In some embodiments, the memory chip 202A is disposed between the stack of the memory chips 202B and the controller chip 225.

The memory chip 202A and the memory chips 202B can be electrically connected to the controller chip 225, respectively. In some embodiments, the controller chip 225 can be used as a controlling device of the memory chip 202A and the memory chips 202B, so as to access memory cells of the memory chip 202A and the memory chips 202B. For example, the controller chip 225 can include row decoder, column decoder, bit lines, word lines, other components, or combinations thereof. In some embodiments, the controller chip 225 can transmit data in and out from the memory chip 202A and the memory chips 202B. In some embodiments, the controller chip 225 includes signal transmission interface, so as to transfer data from the memory chip 202A and the memory chips 202B to the interposer 215.

In some embodiments, the memory device 200 further includes a dielectric material 203 surrounding the stack of the memory chips 202B. In some embodiments, the dielectric material 203 at least covers a bottom surface of the bottommost memory chip 202B, and covers a top surface of the topmost memory chip 202B. In some embodiments, the bottommost memory chip 202B is separated from the memory chip 202A by the dielectric material 203.

The memory device 200 further includes several conductive vias 235 in the dielectric material 203. In some embodiments, each of the conductive vias 235 is in contact with a bottom surface of a corresponding one of the memory chips 202B, and is electrically connected to the corresponding one of the memory chips 202B. In some embodiments, each of the conductive vias 235 extends downwardly from a bottom surface of a corresponding one of the memory chips 202B, and is exposed by a bottom surface of the dielectric material 203. In some embodiments, the conductive vias 235 can be referred to as a through dielectric via (TDV).

The memory device 200 further includes bumps 240A and 240B. The bumps 240A are disposed between the memory chip 202A and the controller chip 225, and electrically connect the memory chip 202A to the controller chip 225. On the other hand, the bumps 240B are disposed between the bottom surface of the dielectric material 203 and the controller chip 225. In some embodiments, the bumps 240B are in contact with corresponding conductive vias 235, so as to electrically connect the memory chips 202B to the controller chip 225. In some embodiments, the bumps 240A and 240B have different dimensions. For example, the height (thickness) of the bumps 240A is less than the height (thickness) of the bumps 240B. In other embodiments, the bumps 240A may be omitted, and the memory chip 202A can be connected to the controller chip 225 through cu—cu bonding.

In some embodiments, the memory chips 202A and 202B are electrically connected to the controller chip 225 through their bottom surfaces. Stated another, the memory chips 202A and 202B are electrically connected to the controller chip 225 from a same side. In some embodiments, only bottom surfaces of the memory chips 202A and 202B include signal transmission interface. In some embodiments, top surfaces and bottom surfaces of the memory chips 202A and 202B include signal transmission interfaces, while the memory chips 202A and 202B are electrically connected to the controller chip 225 only through the bottom surfaces.

In some embodiments, the memory chip 202A and the memory chips 202B include different types of memories. The memory chips 202B may include the memory having NAND architecture as discussed in FIG. 2. In some embodiments, such memory having NAND architecture can have greater endurance and include "volatile" property. On the other hand, the memory chip 202A may include other volatile memory, such as DRAM or SRAM. That is, the memory structure 202 is a hybrid memory structure which includes at least two different types of memories.

In some embodiments, the memory chip 202A may include DRAM, and each of the memory chips 202B includes the volatile memory having NAND architecture as discussed above. In some embodiments, the number of inputs/outputs of the memory chip 202A is $IO_D$, the data rate of the memory chip 202A is $f_D$, and the memory density of the memory chip 202A is $D_D$. On the other hand, the number of inputs/outputs of the memory chip 202B is $IO_N$, the data rate of the memory chip 202B is $f_N$, the memory density of the memory chip 202B is $D_N$, and the number of the memory chips 202B of the stack is $N_s$.

The memory chip 202A and the memory chips 202B satisfy following equations. For example, $IO_D*f_D>=IO_N*f_N*N_s$. That is, the total data rate of one memory chip 202A is greater than total data rate of the stack of the memory chips 202B. In some embodiments, $N_s$ is equal to or greater than 4, and is equal to or less than 32. In some embodiments, $D_N>=8*D_D$. That is, the memory density of each memory chip 202B is equal to or greater than 8 times the memory density of the memory chip 202A. In some embodiments, I $IO_D>=32$ (such as 64/128/256/1024 or more), and $IO_N=8$ or 16. That is, the number of inputs/outputs of each memory chip 202A is greater than the number of inputs/outputs of each memory chip 202B. In some embodiments, the number of the memory chip 202A is not greater than 2.

As an example, if the memory chip 202A is a DRAM, the memory chip 202A includes 8 Gb memory capacity, 1024 inputs/outputs, and 2 Gb/s data rate. On the other hand, if the memory chip 202B is the memory having NAND architecture as discussed above, the memory chip 202B includes 64 Gb memory capacity, 8 inputs/outputs, and 2 Gb/s data rate. In the embodiments of FIG. 3, the stack of the memory chips 202B includes 8 memory chips 202B, and thus the stack includes 512 Gb memory capacity in total and 64 inputs/outputs.

In some embodiments, the memory chip 202B is not limited to the memory having NAND architecture as discussed in FIG. 2. In other embodiments, each of the memory chips 202B may include higher memory density than the memory chip 202A. That is, in a unit area, the each of the memory chips 202B includes more memory cells than the memory chip 202A, and thus a greater memory capacity. For example, the memory chips 202B can also be phase change memory (PCM) or other suitable memories.

The processor chip 210 may include a great number of small cores. For example, the processor chip 210 may include graphics processing unit (GPU). On other embodiments, the processor chip 210 may include GPU, TPU, extremely small CPU, DPU, APU, or the like. In yet other embodiments, the processor chip 210 may include central processing unit (CPU). The processor chip 210 can be electrically connected to the interposer 215 through the bumps 245. The controller chip 225 can be electrically connected to the interposer 215 through the bumps 246. The interposer 215 is used to electrically connect different components, such as the memory structure 202, the processor chip 210, and/or the underlying package substrate 216. In some embodiments, the interposer 215 can be electrically connected to the underlying package substrate 216 through bumps 250. In some embodiments, the package substrate 216 and the bumps 250 can be omitted.

Figure 4:
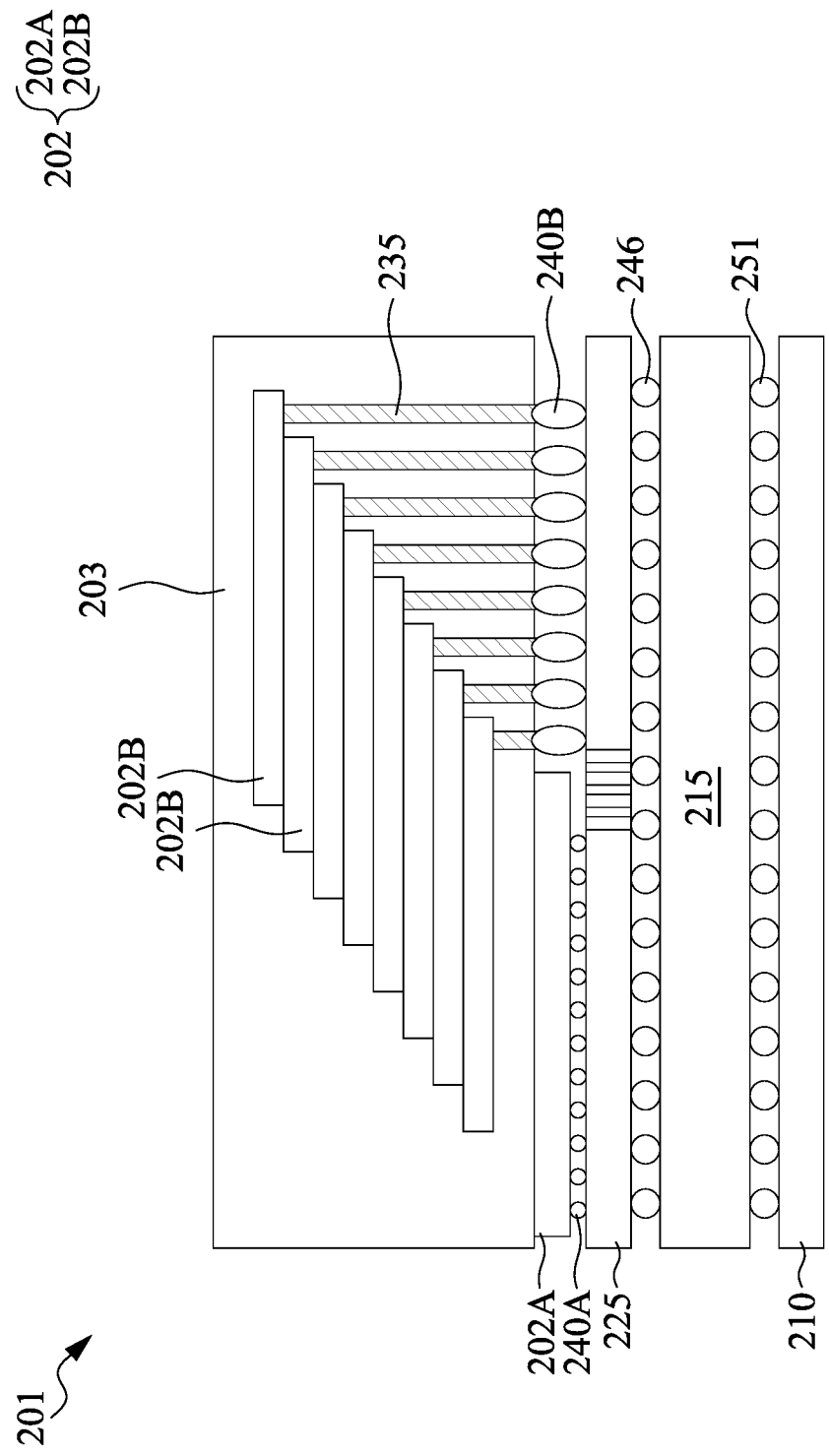
FIG. 4 is a schematic view of a memory device in accordance with some embodiments of the present disclosure.

FIG. 4 is a schematic view of a memory device in accordance with some embodiments of the present disclosure. It is noted that some elements of FIG. 4 is similar to those described in FIG. 3, such elements are labeled the same, and relevant details will not be repeated for brevity.

The memory device 201 of FIG. 4 is different from the memory device 200 of FIG. 3, in that the processor chip 210 of FIG. 4 is disposed on the other side of the interposer 215 opposite to the memory structure 202. That is, in the embodiments of FIG. 3, the processor chip 210 and the memory structure 202 are disposed on the same side of the interposer 215. While in the embodiments of FIG. 4, the processor chip 210 and the memory structure 202 are disposed on opposite sides of the interposer 215.

In greater details, the processor chip 210 of FIG. 4 is electrically connected to the bottom surface of the interposer 215 through the bumps 251. Thus, the processor chip 210 can be electrically connected to the controller chip 225 through the interposer 215. In some embodiments, the interposer 215 can be omitted. That is, the processor chip 210 can be electrically connected to the controller chip 225 only through bumps without other chips. Such configuration can reduce the overall occupied area of the memory device 201.

Figure 5:
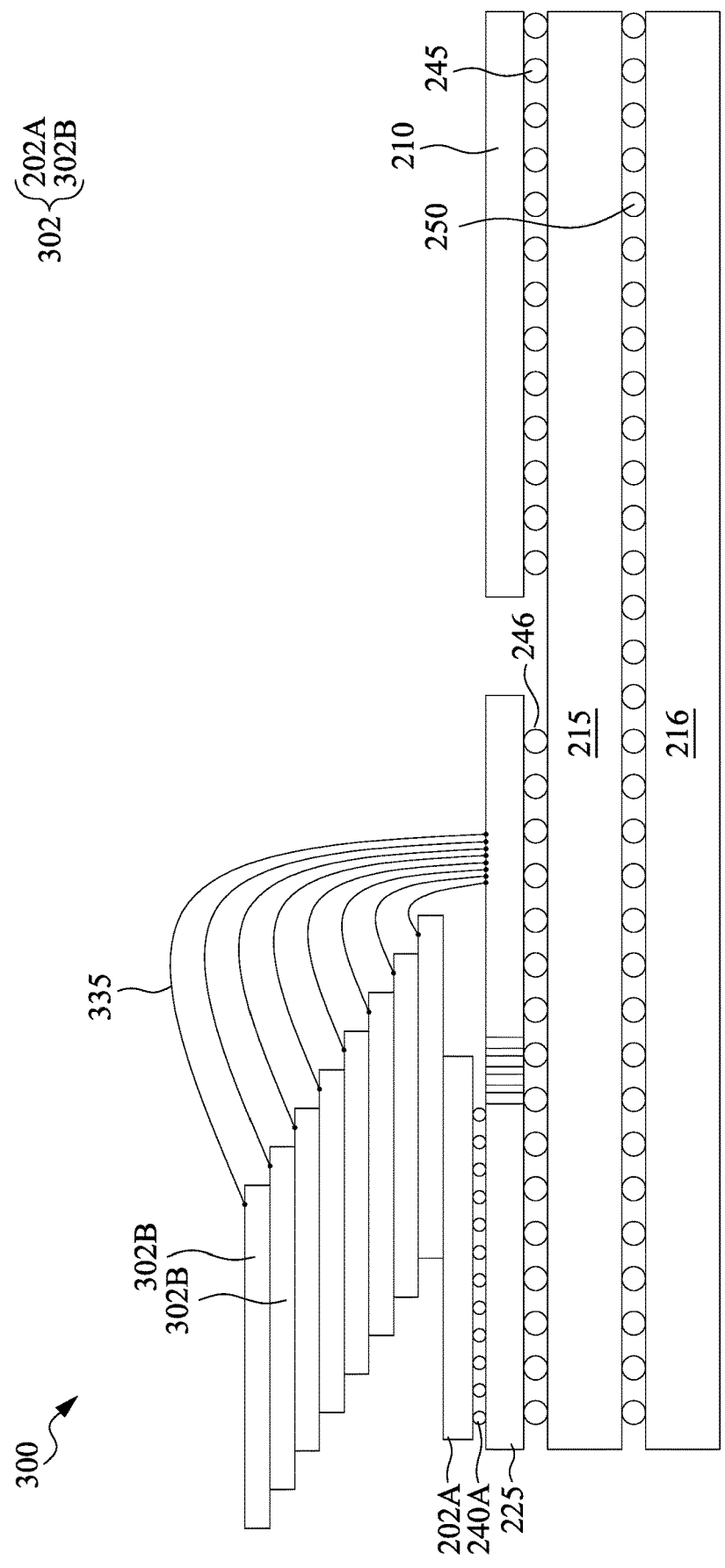
FIG. 5 is a schematic view of a memory device in accordance with some embodiments of the present disclosure.

FIG. 5 is a schematic view of a memory device in accordance with some embodiments of the present disclosure. It is noted that some elements of FIG. 5 is similar to those described in FIG. 3, such elements are labeled the same, and relevant details will not be repeated for brevity.

The memory device 302 of FIG. 5 includes the memory chip 202A and a stack of memory chips 302B, in which the memory chips 302B stacked in a staircase manner. The structure of the memory chips 302B of FIG. 5 is similar to the structure of the memory chips 202B as discussed in FIG. 3, the relationship between the memory chip 202A and the memory chips 302B is similar to the relationship between the memory chip 202A and the memory chips 202B as discussed in FIG. 3, and thus relevant details will not be repeated for brevity.

FIG. 5 is different from FIG. 3, in that the memory chips 302B are electrically connected to the controller chip 225 via wire bonding. In some embodiments, the memory device 302 include several conductive wires 335, in which each conductive wire 335 is in contact with a top surface of a corresponding memory chip 302B, and is electrically connected to the corresponding memory chip 302B. In some embodiments, each conductive wire 335 is connected to the top surface of the corresponding memory chip 302B and the top surface of the controller chip 225. That is, comparing to the memory chips 202B of FIG. 3, each memory chip 302B can be connected to the controller chip 225 only by the conductive wire 335 without using bumps.

In some embodiments, the memory chips 202A is electrically connected to the controller chip 225 through its bottom surface. However, the memory chips 302B is electrically connected to the controller chip 225 through their top surfaces. Stated another, the memory chips 202A and 302B are electrically connected to the controller chip 225 from different sides. In some embodiments, only the bottom surface of the memory chip 202A includes signal transmission interface, and the top surface of the memory chip 202A does not include signal transmission interface. Only the top surfaces of the memory chips 302B include signal transmission interfaces, and the bottom surfaces of the memory chips 302B do not include signal transmission interfaces. In some embodiments, the top surfaces and the bottom surfaces of the memory chips 202A and 302B all include signal transmission interfaces, while the memory chip 202A is electrically connected to the controller chip 225 only through its bottom surface, and the memory chip 302B are electrically connected to the controller chip 225 only through their top surfaces.

Figure 6:
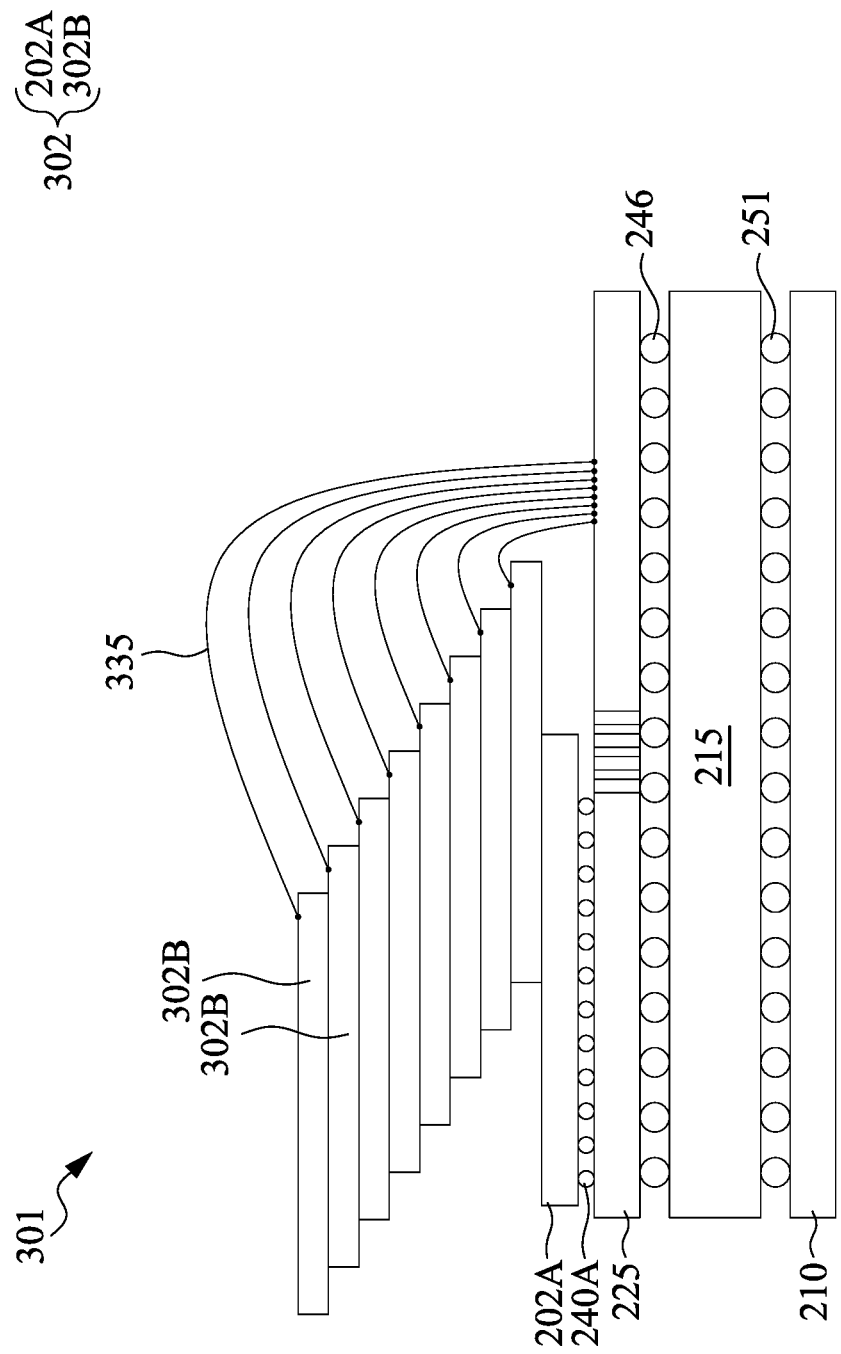
FIG. 6 is a schematic view of a memory device in accordance with some embodiments of the present disclosure.

FIG. 6 is a schematic view of a memory device in accordance with some embodiments of the present disclosure. It is noted that some elements of FIG. 6 is similar to those described in FIG. 5, such elements are labeled the same, and relevant details will not be repeated for brevity.

The memory device 301 of FIG. 6 is different from the memory device 300 of FIG. 5, in that the processor chip 210 of FIG. 6 is disposed on the other side of the interposer 215 opposite to the memory structure 202. That is, in the embodiments of FIG. 5, the processor chip 210 and the memory structure 202 are disposed on the same side of the interposer 215. While in the embodiments of FIG. 6, the processor chip 210 and the memory structure 202 are disposed on opposite sides of the interposer 215.

In greater details, the processor chip 210 of FIG. 6 is electrically connected to the bottom surface of the interposer 215 through the bumps 251. Thus, the processor chip 210 can be electrically connected to the controller chip 225 through the interposer 215. In some embodiments, the interposer 215 can be omitted. That is, the processor chip 210 can be electrically connected to the controller chip 225 only through bumps without other chips. Such configuration can reduce the overall occupied area of the memory device 301.

The present disclosure provides a memory device that is suitable for artificial intelligence calculation. Such memory device only needs few first memory chips with high speed (such as the memory chip 202A discussed in FIGS. 3 to 6). Furthermore, the memory device can be integrated with several second memory chips with high density (such as the memory chips 202B and 302B discussed in FIGS. 3 to 6). During the write operation discussed in FIG. 1, controller chip (such as the controller chip 225 discussed in FIGS. 3 to 6) can write data into the first memory chip (such as the memory chip 202A) in a first time duration (such as the first stage a and the second stage b), and can duplicate data from the first memory chip to the second memory chips (such as the memory chips 202B or 302B) in a second time duration (such as the third stage c). Similarly, during a read operation discussed in FIG. 1, controller chip (such as the controller chip 225 discussed in FIGS. 3 to 6) can duplicate data from the second memory chips (such as the memory chips 202B or 302B) to the first memory chip (such as the memory chip 202A) in a first time duration (such as the first stage a and the second stage b), and can transmit the data from the first memory chip (such as the memory chip 202A) to a processor chip (such as the processor chip 210) in a second time duration (such as the third stage c).

According to the aforementioned embodiments, it can be seen that the present disclosure offers advantages in fabricating integrated circuits. It is understood, however, that other embodiments may offer additional advantages, and not all advantages are necessarily disclosed herein, and that no particular advantage is required for all embodiments. In calculation of big data and artificial intelligence parallel calculation and deep learning are commonly used to solve different problems. Thus, large and deep structure needs large memories. Data will be stored for a longer time, and the requirement of the read/write is reduced. On advantage of the disclosure is that a volatile memory having NAND architecture is used in calculation of big data and artificial intelligence, the memory density can be increased, the total inputs/outputs can be increased, and the device performance can be further improved.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:
   a memory structure, comprising:
      a first memory chip; and
      a stack of a plurality of second memory chips, wherein a memory density of each of the second memory chips is greater than a memory density of the first memory chip;
   a controller chip electrically connected to the first memory chip and the second memory chips;
   a processor chip electrically connected to the controller chip;

a plurality of first bumps in contact with a bottom surface of the first memory chip and a top surface of the controller chip;
a plurality of conductive vias in contact with bottom surfaces of the second memory chips, respectively; and
a plurality of second bumps connecting the conductive vias respectively to the top surface of the controller chip.

2. The memory device of claim 1, wherein the second memory chips are stacked in a staircase manner.

3. The memory device of claim 1, wherein a number of the second memory chips is equal to or greater than 4.

4. The memory device of claim 1, wherein the first memory chip comprises a volatile memory, and each of the second memory chips comprises a memory different from the volatile memory.

5. The memory device of claim 1, wherein the memory density of the second memory chips is equal to or greater than 8 times the memory density of the first memory chip.

6. The memory device of claim 1, wherein
the first memory chip comprises a number of inputs/outputs $IO_D$ and a data rate $f_D$,
each of the second memory chips comprises a number of inputs/outputs $IO_N$, a data rate $f_D$, and a number of the second memory chips is $N_s$,
the first memory chip and the second memory chips satisfy $IO_D * f_D >= IO_N * f_N * N_s$.

7. The memory device of claim 1, wherein a number of inputs/outputs of the first memory chip is greater than a number of inputs/outputs of each of the second memory chips.

8. The memory device of claim 1, wherein the first memory chip is between the stack of the second memory chips and the controller chip.

9. The memory device of claim 1, wherein each of the second memory chips has a NAND architecture.

10. The memory device of claim 9, wherein the NAND architecture comprises:
a bit line;
word lines;
memory units connected in series, wherein the word lines are electrically connected to the memory units, respectively; and
a transistor connecting one of the memory units to the bit line.

11. The memory device of claim 9, wherein the first memory chip comprises a DRAM.

12. The memory device of claim 1, further comprising a dielectric material surrounding the stack of the second memory chips.

13. The memory device of claim 12, wherein the first memory chip is separated from a bottommost one of the second memory chips by the dielectric material.

14. The memory device of claim 1, wherein the first memory chip is electrically connected to the controller chip through a bottom side of the first memory chip, and each of the second memory chips is electrically connected to the controller chip through a bottom side of each of the second memory chips.

15. The memory device of claim 1, further comprising an interposer electrically connecting the controller chip to the processor chip, wherein the controller chip and the processor chip are disposed on a same side of the interposer.

16. The memory device of claim 1, further comprising an interposer electrically connecting the controller chip to the processor chip, wherein the controller chip and the processor chip are disposed on opposite sides of the interposer.

\* \* \* \* \*